US006694033B1

(12) United States Patent
Rimell et al.

(10) Patent No.: US 6,694,033 B1
(45) Date of Patent: Feb. 17, 2004

(54) REPRODUCTION OF SPATIALIZED AUDIO

(75) Inventors: Andrew Rimell, Ipswich (GB); Michael Peter Hollier, Ipswich (GB)

(73) Assignee: British Telecommunications public limited company, London (GB)

( * ) Notice: Subject to any disclaimer, the term of this patent is extended or adjusted under 35 U.S.C. 154(b) by 0 days.

(21) Appl. No.: 09/101,382

(22) PCT Filed: Jun. 1, 1998

(86) PCT No.: PCT/GB98/01594

§ 371 (c)(1), (2), (4) Date: Jul. 9, 1998

(87) PCT Pub. No.: WO98/58523

PCT Pub. Date: Dec. 23, 1998

(30) Foreign Application Priority Data

Jun. 17, 1997 (EP) ........................................ 97304218

(51) Int. Cl.[7] ........................ H04R 5/02; H04R 5/00; H03G 5/00

(52) U.S. Cl. ....................... 381/307; 380/300; 380/17; 380/19; 380/22; 380/97

(58) Field of Search ............................ 381/307, 300, 381/17, 18, 61, 23, 22, 97

(56) References Cited

U.S. PATENT DOCUMENTS 4,392,019 A * 7/1983 Halliday .................... 381/19
5,199,075 A * 3/1993 Fosgate .................... 381/307
5,307,415 A * 4/1994 Fosgate .................... 381/22
5,757,927 A * 5/1998 Gerzon et al. ............... 381/20
6,363,155 B1 * 3/2002 Horbach .................... 381/17

* cited by examiner

*Primary Examiner*—Forester W. Isen
*Assistant Examiner*—L. Grier
(74) *Attorney, Agent, or Firm*—Nixon & Vanderhye P.C.

(57) ABSTRACT

Immersive environments for teleconferencing, collaborative shared spaces and entertainment require spatial audio. Such environments may have non-ideal sound reproduction conditions (loudspeaker positioning, listener placement or listening room geometry) where wavefront-synthesis techniques, such as ambisonics, will not give listeners the correct audio spatialization. A method disclosed for generating a sound field from a spatialized original audio signal, wherein the original signal is configured to produce an optimal sound percept at one predetermined ideal location. A plurality of output signal components are generated, each for reproduction by one of an array of loudspeakers. Antiphase output components are attenuated such that their contribution to the spatial sound percept is reduced for locations other than the predetermined ideal location. Position components defining the location of a virtual sound source, normalized to the loudspeaker distance from the ideal location, can be adapted to generate a warped sound field by raising the position components to a power greater than unity, such that the virtual sound source is perceived by listeners in the region surrounded by the loudspeakers to be spaced from the loudspeaker.

8 Claims, 8 Drawing Sheets

Listener/source geometry for a 2-dimensional encoding system

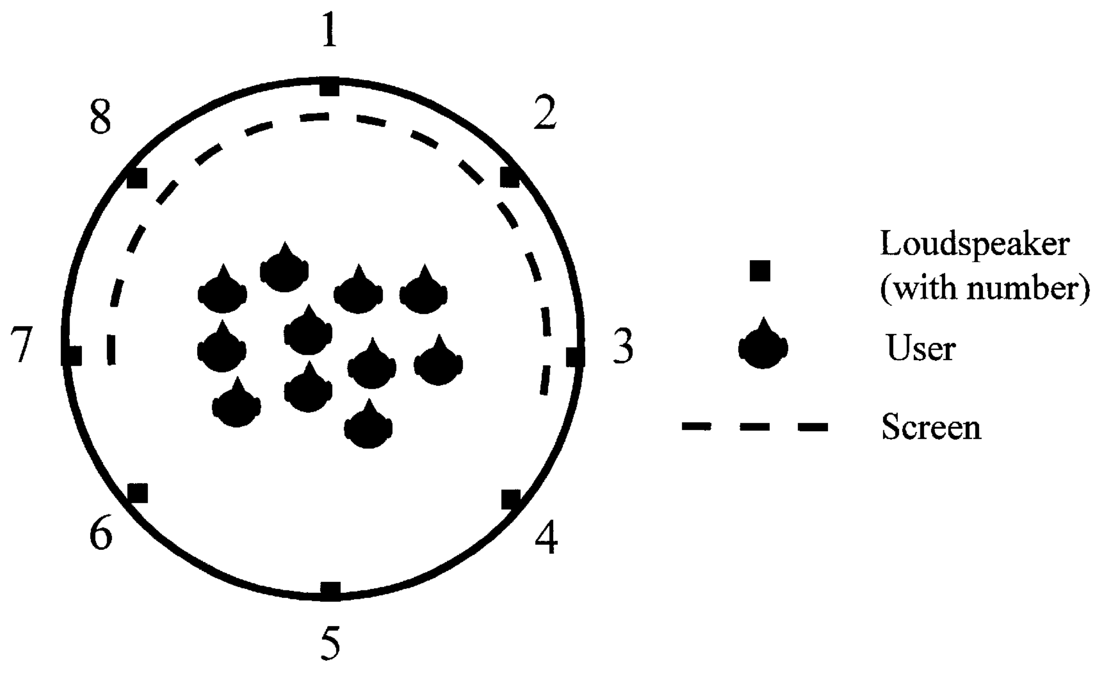
Figure 1: VisionDome plan
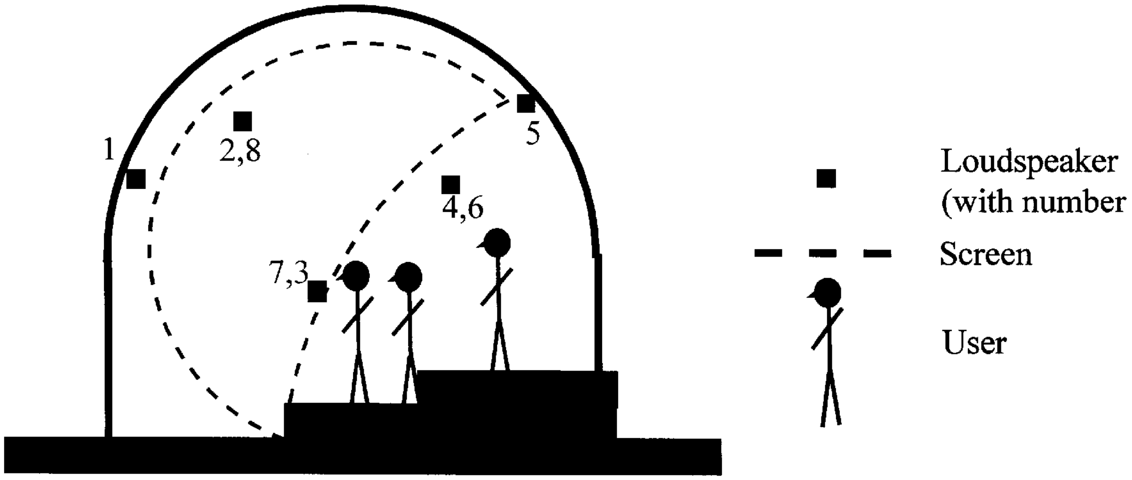
Figure 2: VisionDome cross-section

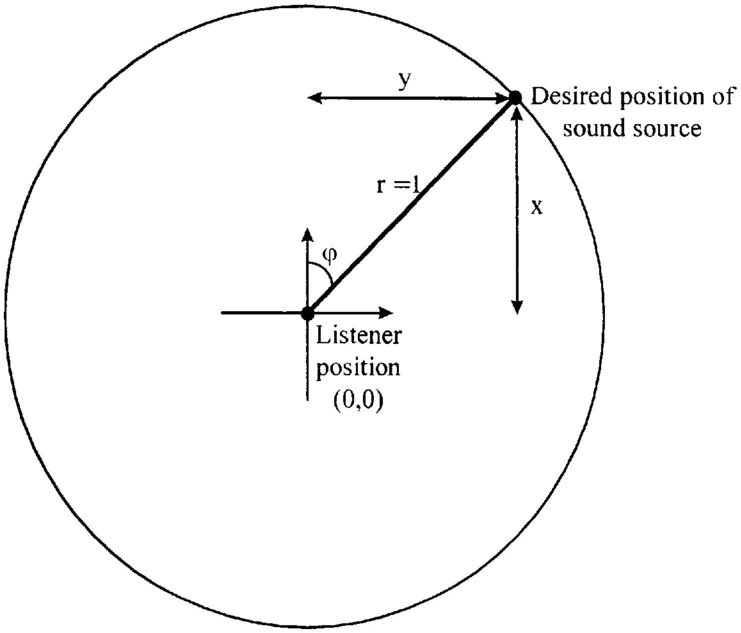
Figure 3: Listener/source geometry for a 2-dimensional encoding system
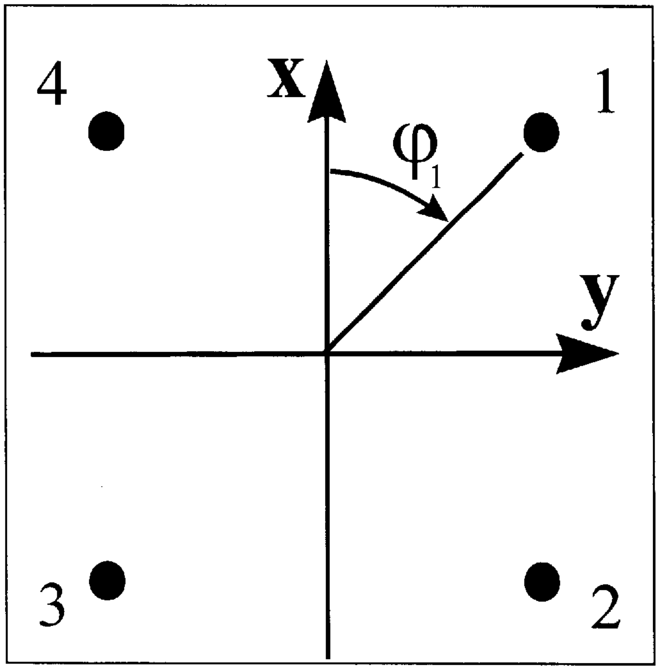
Figure 4: Two-dimensional loudspeaker layout for 4 speakers

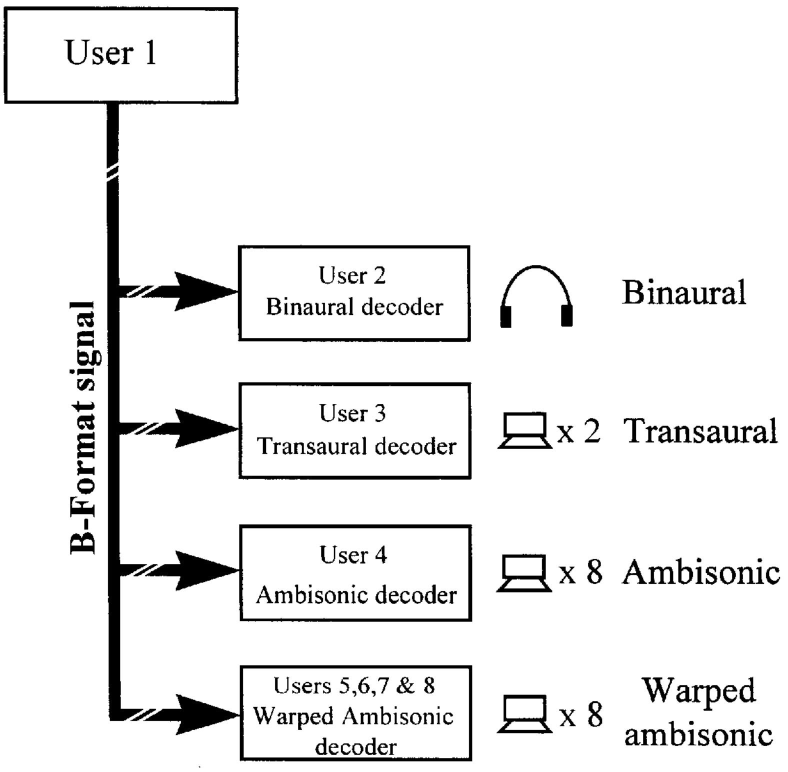
Figure 5: Different audio decoding options for a multi-user virtual meeting place system
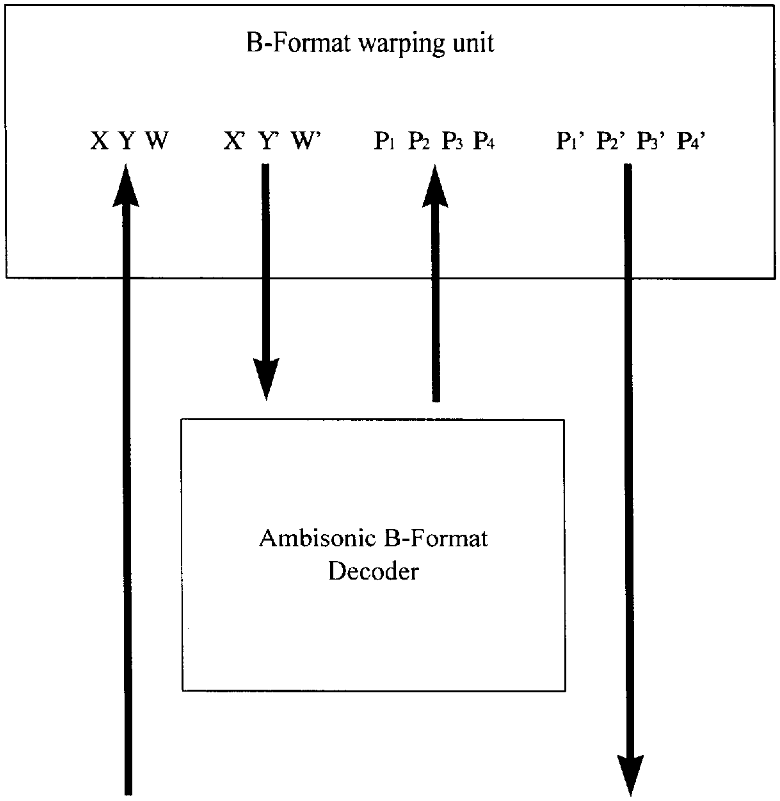
Figure 6: Two dimensional B-Format warping example with four loudspeakers in a non-regular array

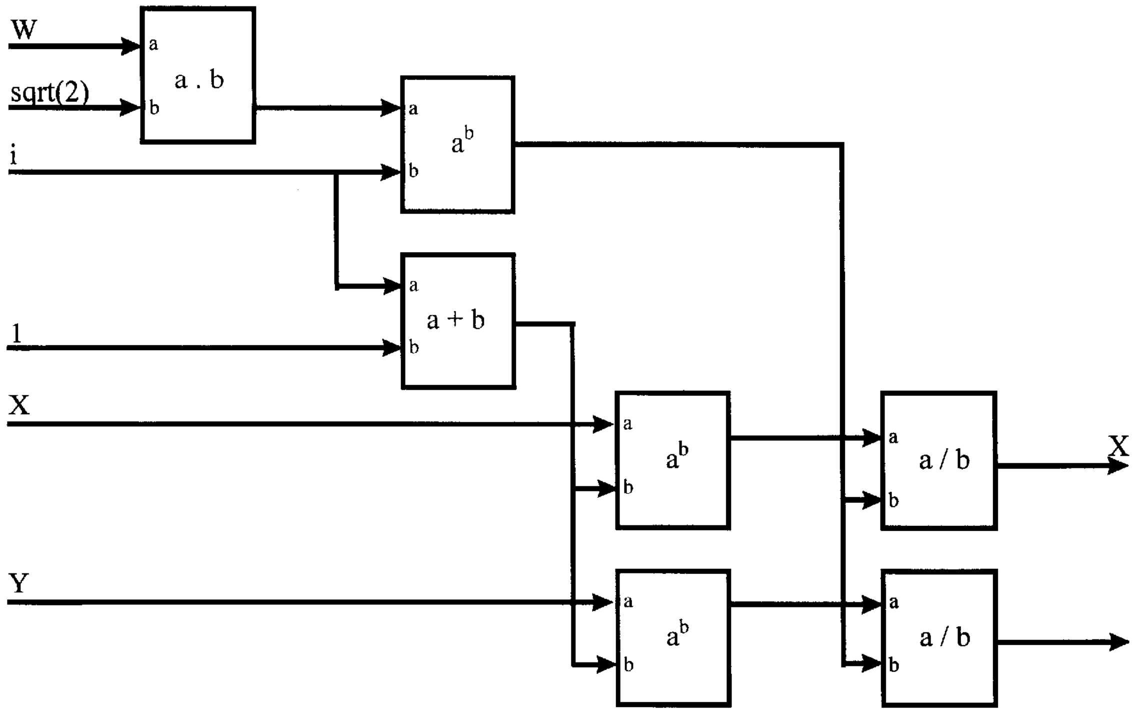
Figure 7: B-Format warper block diagram
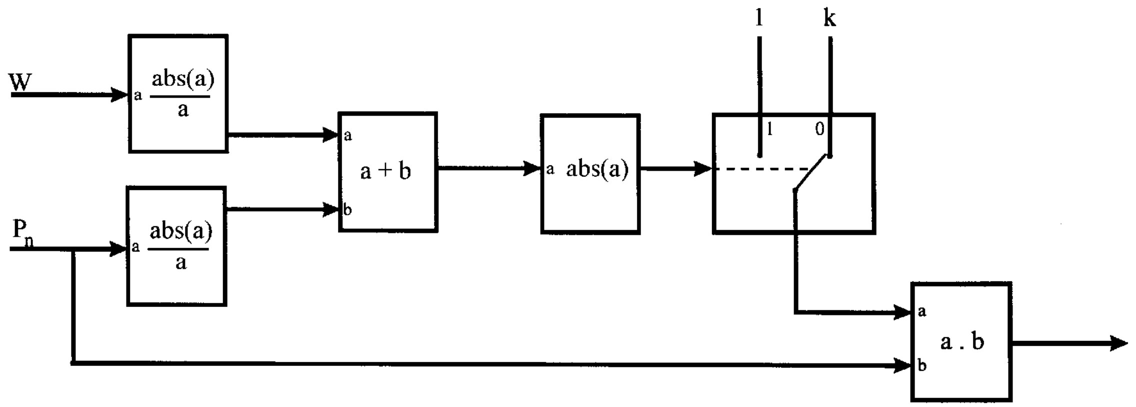
Figure 8: Block diagram of one decoder warp channel

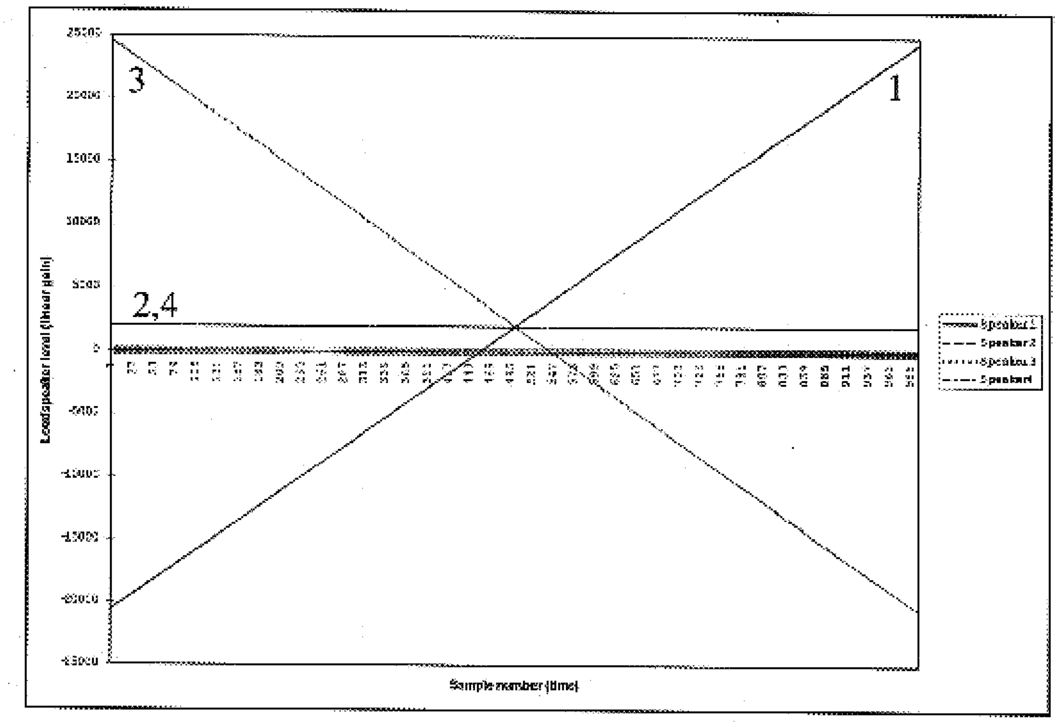
Figure 9: B-Format decoding
loudspeaker levels for a virtual sound source moving from (-1,-1) to (1,1)
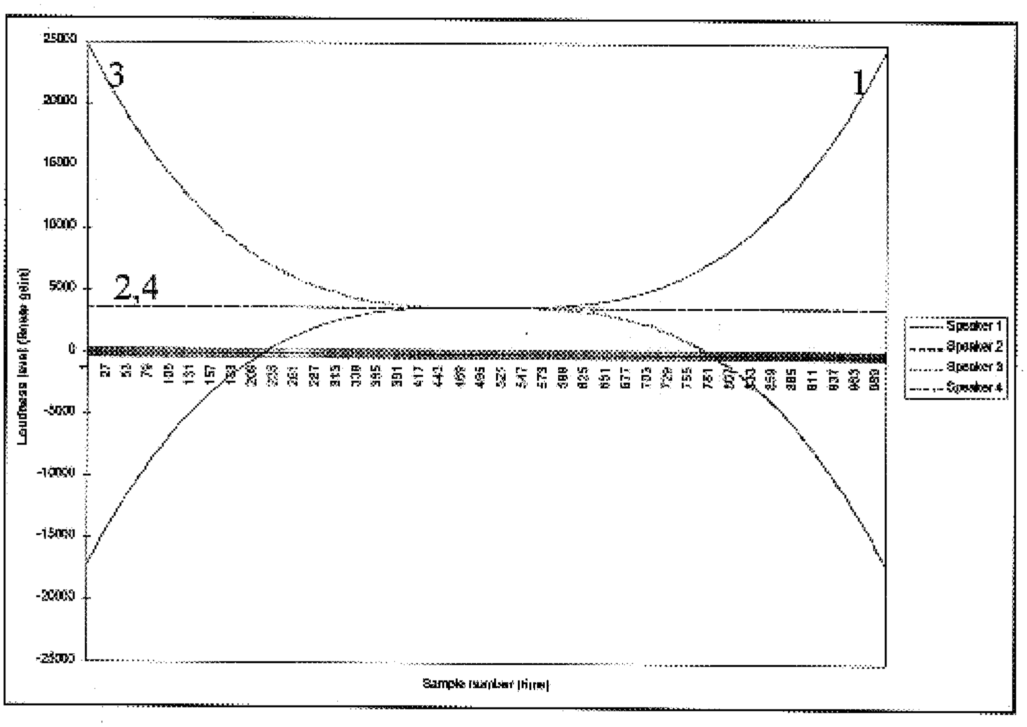
Figure 10: B′-Format decoding
loudspeaker levels for a virtual sound source moving from (-1,-1) to (1,1)

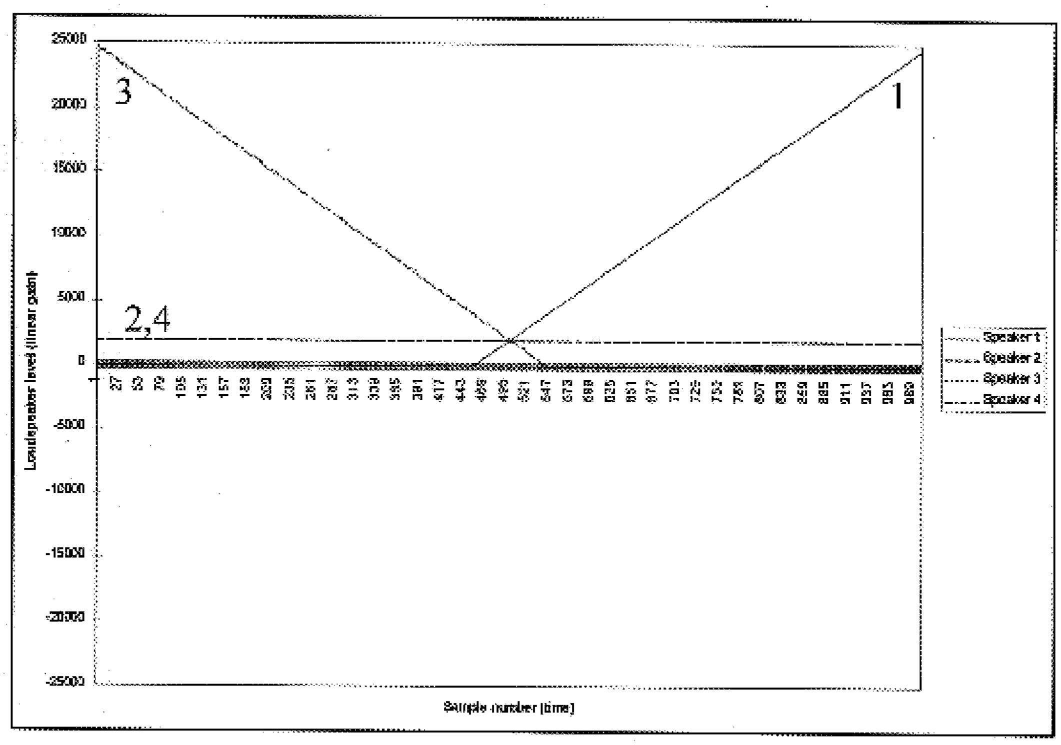
Figure 11: B-Format decoding with decoder warping loudspeaker levels for a virtual sound source moving from (-1,-1) to (1,1)
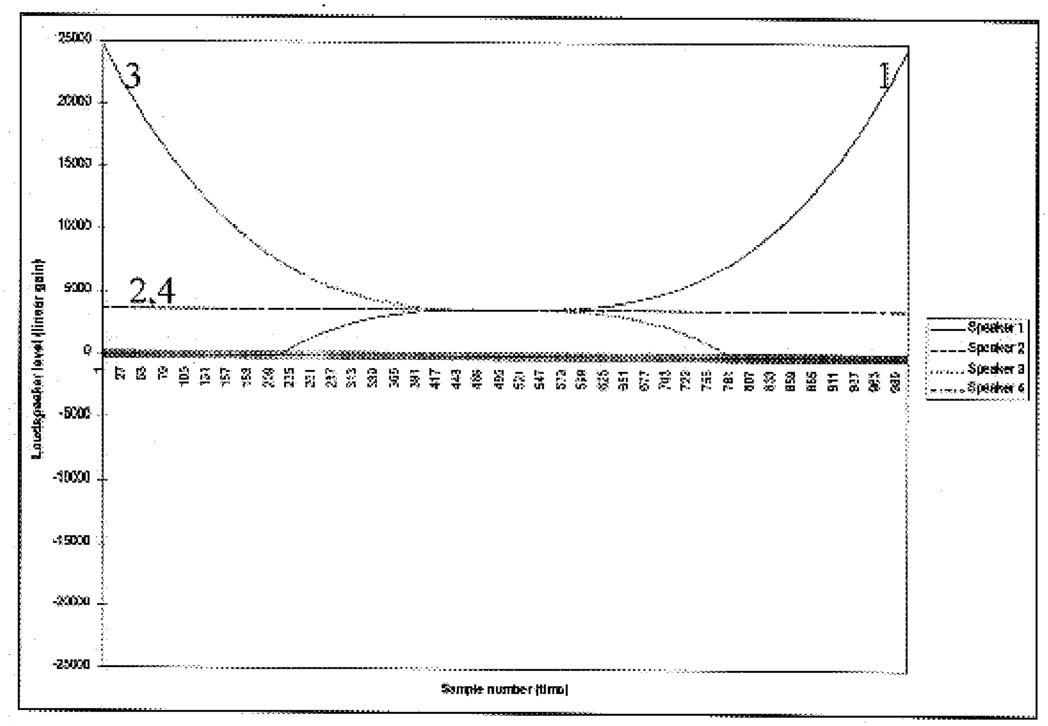
Figure 12: B′-Format decoding with decoder warping loudspeaker levels for a virtual sound source moving from (-1,-1) to (1,1)

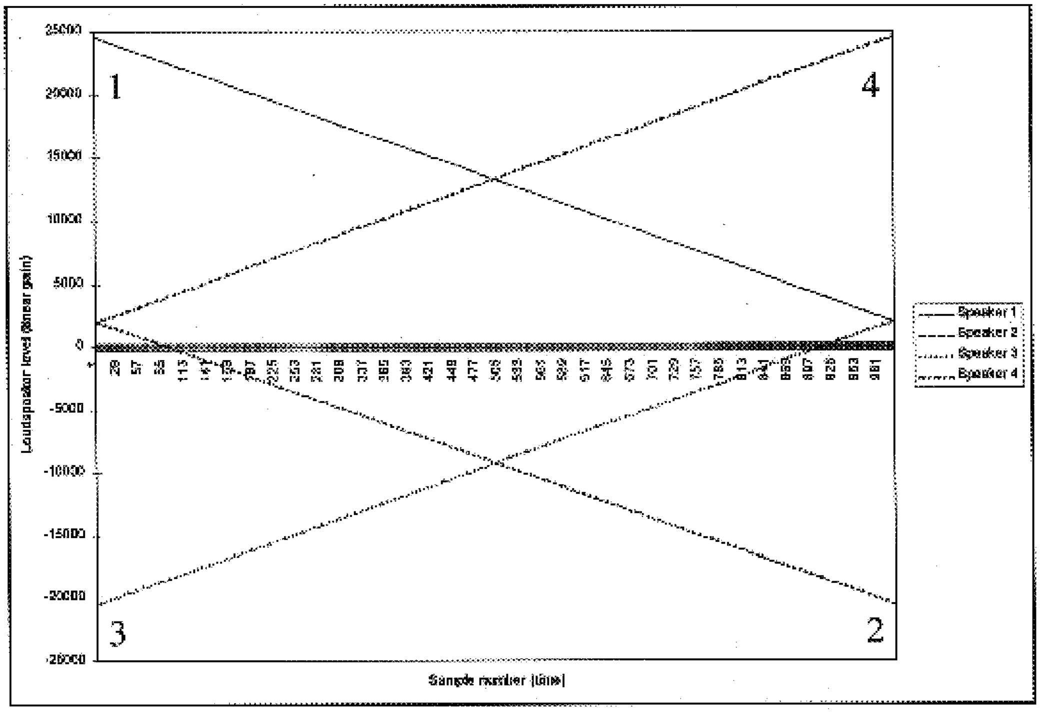
Figure 13: B-Format decoding
loudspeaker levels for a virtual sound source moving from (-1,1) to (1,1)
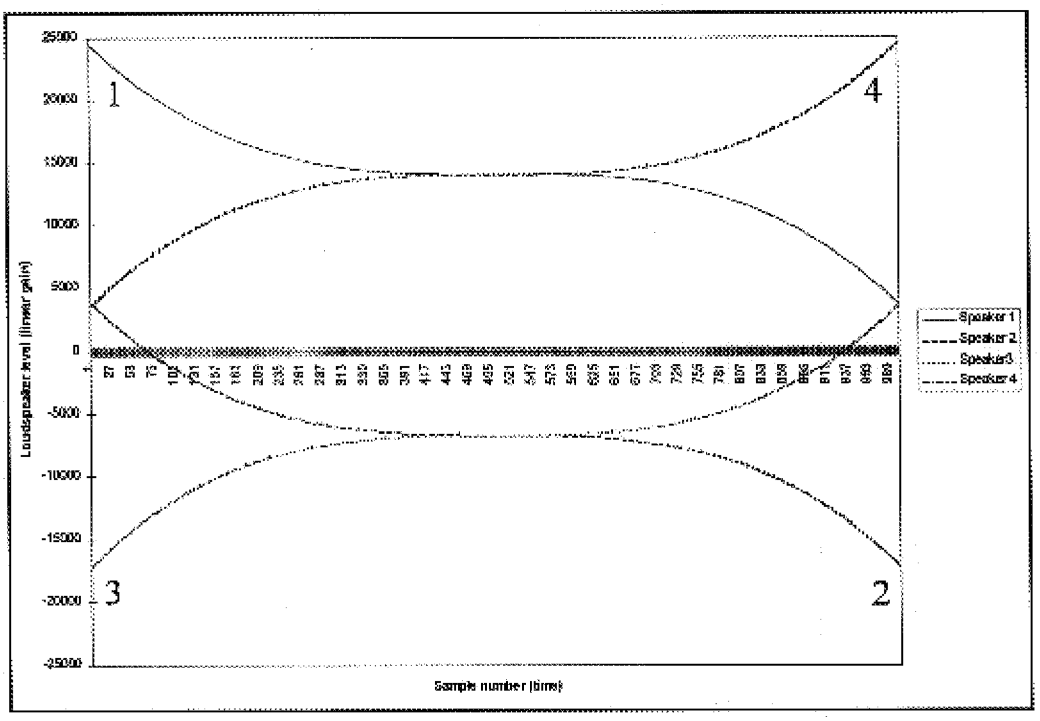
Figure 14: B′-Format decoding
loudspeaker levels for a virtual sound source moving from (-1,1) to (1,1)

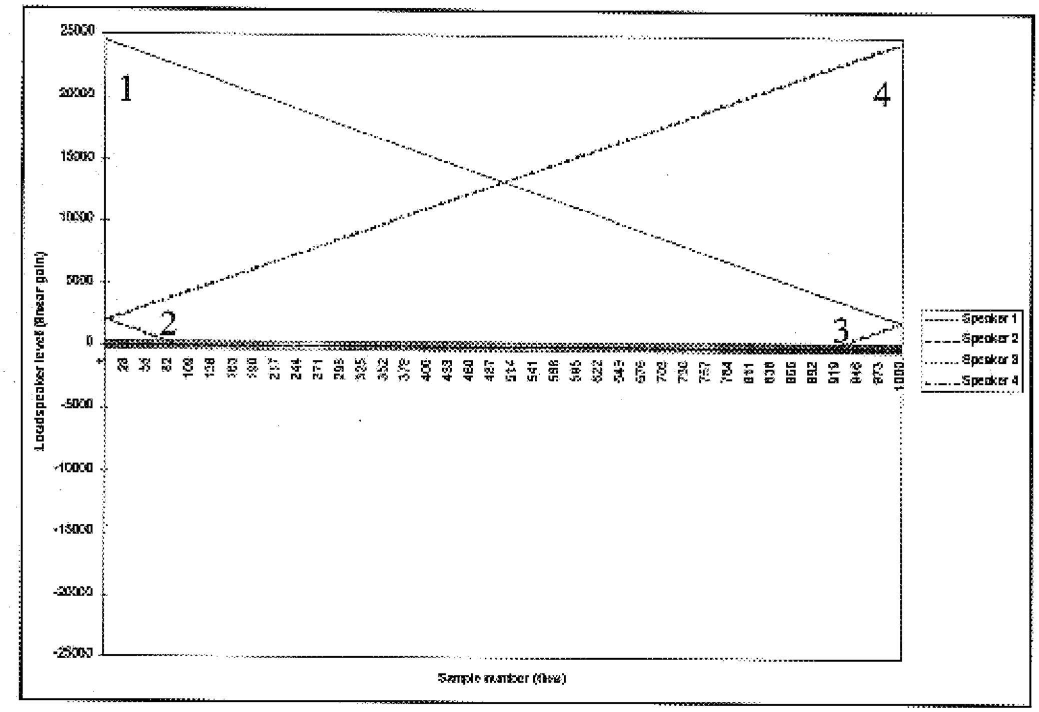
Figure 15: B-Format decoding with decoder warping loudspeaker levels for a virtual sound source moving from (-1,1) to (1,1)
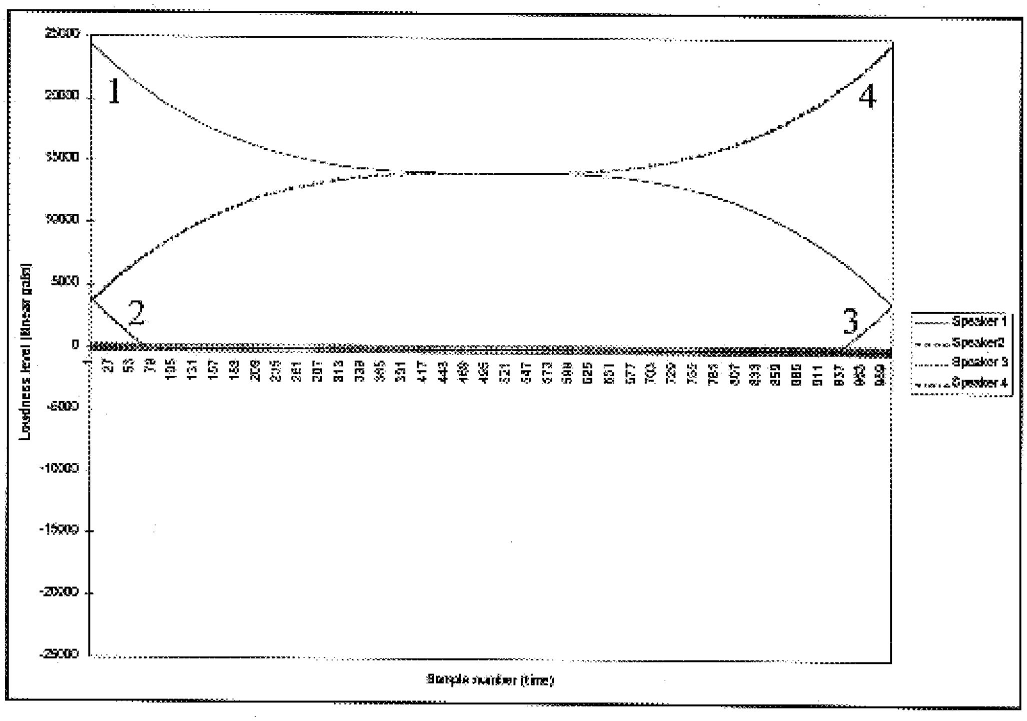
Figure 16: B′-Format decoding with decoder warping loudspeaker levels for a virtual sound source moving from (-1,1) to (1,1)

REPRODUCTION OF SPATIALIZED AUDIO

BACKGROUND OF THE INVENTION

1. Field of the Invention

This invention relates to the reproduction of spatialised audio in immersive environments with non-ideal acoustic conditions.

2. Related Art

Immersive environments are expected to be an important component of future communication systems. An immersive environment is one in which the user is given the sensation of being located within an environment depicted by the system, rather than observing it from the exterior as he would with a conventional flat screen such as a television. This "immersion" allows the user to be more fully involved with the subject material. For the visual sense, an immersive environment can be created by arranging that the whole of the user's field of vision is occupied with a visual presentation giving an impression of three dimensionality and allowing the user to perceive complex geometry.

For the immersive effect to be realistic, the user must receive appropriate inputs to all the senses which contribute to the effect. In particular, the use of combined audio and video is an important aspect of most immersive environments: see for example:

ANDERSON. D. & CASEY. M. "*Virtual worlds—The sound dimension*" *IEEE Spectrum* 1997, Vol. 34, No 3, pp 46–50:

BRAHAM. R. & COMERFORD. R. "*Sharing virtual worlds*" *IEEE Spectrum* 1997, Vol. 34, No 3, pp 18–20

WATERS. R & BARRUS. J "The rise of *shared virtual environments*" *IEEE Spectrum* 1997, Vol. 34, No 3, pp 20–25.

Spatialised audio, the use of two or more loudspeakers to generate an audio effect perceived by the listener as emanating from a source spaced from the loudspeakers, is well-known. In its simplest form, stereophonic effects have been used in audio systems for several decades. In this specification the term "virtual" sound source is used to mean the apparent source of a sound, as perceived by the listener, as distinct from the actual sound sources, which are the loudspeakers.

Immersive environments are being researched for use in Telepresence, teleconferencing, "flying through" architect's plans, education and medicine. The wide field of vision, combined with spatialised audio, create a feeling of "being there" which aids the communication process, and the additional sensation of size and depth can provide a powerful collaborative design space.

Several examples of immersive environment are described by D. M. Traill, J. J. Bowskill and P. J. Lawrence in "Interactive Collaborative Media Environments" (*British Telecommunications Technology Journal* Vol. 15, No. 4 (October 1997), pages 130 to 139. One example of an immersive environment is the BT/ARC VisionDome, (described on pages 135 to 136 and FIG. 7 of that article), in which the visual image is presented on a large concave screen with the users inside (see FIGS. 1 and 2). A multi-channel spatialised audio system having eight loudspeakers is used to provide audio immersion. Further description may be found at:

A second example is the "SmartSpace" chair described on pages 134 and 135 (and FIG. 6) of the same article, which combines a wide-angle video screen, a computer terminal and spatialised audio, all arranged to move with the rotation of a swivel chair—a system currently under development by British Telecommunications plc. Rotation of the chair causes the user's orientation in the environment to change, the visual and audio inputs being modified accordingly. The SmartSpace chair uses transaural processing, as described by COOPER. D. & BAUCK. J. "*Prospects for transaural recording*", *Journal of the Audio Engineering Society* 1989, Vol. 37, No 1/2, pp 3–19, to provide a "sound bubble" around the user, giving him the feeling of complete audio immersion, while the wrap-around screen provides visual immersion.

Where the immersive environment is interactive, images and spatialised sound are generated in real-time (typically as a computer animation), while non-interactive material is often supplied with an ambisonic B-Format sound track, the characteristics of which are to be described later in this specification. Ambisonic coding is a popular choice for immersive audio environments as it is possible to decode any number of channels using only three or four transmission channels. However, ambisonic technology has its limitations when used in telepresence environments, as will be discussed.

Several issues regarding sound localisation in immersive environments will now be considered. FIGS. 1 and 2 show a plan view and side cross section of the VisionDome, with eight loudspeakers (1, 2, 3, 4, 5, 6, 7, 8), the wrap-around screen, and typical user positions marked. Multi-channel ambisonic audio tracks are typically reproduced in rectangular listening rooms. When replayed in a hemispherical dome, spatialisation is impaired by the geometry of the listening environment. Reflections within the hemisphere can destroy the sound-field recombination: although this can sometimes be minimised by treating the wall surfaces with a suitable absorptive material, this may not always be practical. The use of a hard plastic dome as a listening room creates many acoustic problems mainly caused by multiple reflections. The acoustic properties of the dome, if left untreated, cause sounds to seem as if they originate from multiple sources and thus the intended sound spatialisation effect is destroyed. One solution is to cover the inside surface of the dome with an absorbing material which reduces reflections. The material of the video screen itself is sound absorbent, so it assists in the reduction of sound reflections but it also causes considerable high-frequency attenuation to sounds originating from loudspeakers located behind the screen. This high-frequency attenuation is overcome by applying equalisation to the signals fed into the loudspeakers 1, 2, 3, 7, 8 located behind the screen.

Listening environments other than a plastic dome have their own acoustic properties and in most cases reflections will be a cause of error. As with a dome, the application of acoustic tiles will reduce the amount of reflections, thereby increasing the users' ability to accurately localise audio signals.

Most projection screens and video monitors have a flat (or nearly flat) screen. When a pre-recorded B-Format sound track is composed to match a moving video image, it is typically constructed in studios with such flat video screens. To give the correct spatial percept (perceived sound field) the B-Format coding used thus maps the audio to the flat video screen. However, when large multi-user environments, such as the VisionDome, are used, the video is replayed on a concave screen, the video image being suitably modified to appear correct to an observer. However, the geometry of the audio effect is no longer consistent with the video and a non-linear mapping is required to restore the perceptual synchronisation. In the case of interactive material, the B-Format coder locates the virtual source onto the circumference of a unit circle thus mapping the curvature of the screen.

In environments where a group of listeners are situated in a small area an ambisonic reproduction system is likely to fail to produce the desired auditory spatialisation for most of them. One reason is that the various sound fields generated by the loudspeakers only combine correctly to produce the desired effect of a "virtual" sound source at one position, known as the "sweet-spot". Only one listener (at most) can be located in the precise sweet-spot. This is because the true sweet-spot, where in-phase and anti-phase signals reconstruct correctly to give the desired signal, is a small area and participants outside the sweet-spot receive an incorrect combination of in-phase and anti-phase signals. Indeed, for a hemispherical screen, the video projector is normally at the geometric centre of the hemisphere, and the ambisonics are generally arranged such that the "sweet spot" is also at the geometric centre of the loudspeaker array, which is arranged to be concentric with the screen. Thus, there can be no-one at the actual "sweet spot" since that location is occupied by the projector.

The effect of moving the sweet-spot to coincide with the position of one of the listeners has been investigated by BURRASTON, HOLLIER & HAWKSFORD ("*Limitations of dynamically controlling the listening position in a 3-D ambisonic environment" Preprint from* 102$^{nd}$ *AES Convention* March 1997 *Audio Engineering Society* (Preprint No 4460)). This enables a listener not located in the original sweet-spot to receive the correct combination of ambisonic decoded signals. However, this system is designed only for single users as the sweet-spot can only be moved to one position at a time. The paper discusses the effects of a listener being positioned outside the sweet-spot (as would happen with a group of users in a virtual meeting place) and, based on numerous formal listening tests, concludes that listeners can correctly localise the sound only when they are located on the sweet-spot.

When a sound source is moving, and the listener is in a non-sweet-spot position, interesting effects are noted. Consider an example where the sound moves from front right to front left and the listener is located off-centre and close to the front. The sound initially seems to come from the right loudspeaker, remains there for a while and then moves quickly across the centre to the left loudspeaker—sounds tend to "hang" around the loudspeakers causing an acoustically hollow centre area or "hole". For listeners not located at the sweet spot, any virtual sound source will generally seem to be too close to one of the loudspeakers. If it is moving smoothly through space (as perceived by a listener at the sweet spot), users not at the sweet spot will perceive the virtual source staying close to one loudspeaker location, and then suddenly jumping to another loudspeaker.

The simplest method of geometric co-ordinate correction involves warping the geometric positions of the loudspeakers when programming loudspeaker locations into the ambisonic decoder. The decoder is programmed for loudspeaker positions closer to the centre than their actual positions: this results in an effect in which the sound moves quickly at the edges of the screen and slowly around the centre of the screen—resulting in a perceived linear movement of the sound with respect to an image on the screen. This principle can only be applied to ambisonic decoders which are able to decode the B-Format signal to selectable loudspeaker positions, i.e. it can not be used with decoders designed for fixed loudspeaker positions (such as the eight corners of a cube or four corners of a square).

BRIEF SUMMARY OF THE INVENTION

A non-linear panning strategy has been developed which takes as its input the monophonic sound source, the desired sound location (x,y,z) and the locations of the N loudspeakers in the reproduction system (x,y,z). This system can have any number of separate input sources which can be individually localised to separate points in space. A virtual sound source is panned from one position to another with a non-linear panning characteristic. The non-linear panning corrects the effects described above, in which an audio "hole" is perceived. The perceptual experience is corrected to give a linear audio trajectory from original to final location. The non-linear panning scheme is based on intensity panning and not wavefront reconstruction as in an ambisonic system. Because the warping is based on intensity panning there is no anti-phase signal from the other loudspeakers and hence with a multi-user system all of the listeners will experience correctly spatialised audio. The non-linear warping algorithm is a complete system (i.e. it takes a signal's co-ordinates and positions it in 3-dimensional space), so it can only be used for real-time material and not for warping ambisonic recordings.

According to the present invention, there is provided a method of generating a sound field from an array of loudspeakers, the array defining a listening space wherein the outputs of the loudspeakers combine to give a spatial perception of a virtual sound source, the method comprising the generation, for each loudspeaker in the array, of a respective output component $P_n$ for controlling the output of the respective loudspeaker, the output being derived from data carried in an input signal, the data comprising a sum reference signal W, and directional sound components X, Y, (Z) representing the sound component in different directions as produced by the virtual sound source, wherein the method comprises the steps of recognising, for each loudspeaker, whether the respective component $P_n$ is changing in phase or antiphase to the sum reference signal W, modifying said signal if it is in antiphase, and feeding the resulting modified components to the respective loudspeakers.

According to a second aspect of the invention, there is provided apparatus for generating a sound field, comprising an array of loudspeakers defining a listening space wherein the outputs of the loudspeakers combine to give a spatial perception of a virtual sound source, means for receiving and processing data carried in an input signal, the data comprising a sum reference signal W, and directional information components X, Y, (Z) indicative of the sound in different directions as produced by the virtual sound source, means for the generation from said data of a respective output component $P_n$ for controlling the output of each loudspeaker in the array, means for recognising, for each loudspeaker, whether the respective component $P_n$ is changing in phase or antiphase to the sum reference signal W, means for modifying said signal if it is in antiphase, and means for feeding the resulting modified components to the respective loudspeakers.

Preferably the directional sound components are each multiplied by a warping factor which is a function of the respective directional sound component, such that a moving virtual sound source following a smooth trajectory as perceived by a listener at any point in the listening field also follows a smooth trajectory as perceived at any other point in the listening field. This ensures that virtual sound sources do not tend to occur in certain regions of the listening field more than others. The warping factor may be a square or higher even-numbered power, or a sinusoidal function, of the directional sound component.

The ambisonic B-Format coding and decoding equations for 2-dimensional reproduction systems will now be briefly discussed. This section does not discuss the detailed theory of ambisonics but states the results of other researchers in the field. Ambisonic theory presents a solution to the problem of encoding directional information into an audio signal. The signal is intended to be replayed over an array of at least four loudspeakers (for a pantophonic—horizontal plane—system) or eight loudspeakers (for a periphonic—horizontal and vertical plane—system). The signal, termed "B-Format" consists (for the first order case) of three components for pantophonic systems (W,X,Y) and four components for periphonic systems (W,X,Y,Z). For a detailed analysis of surround sound and ambisonic theory, see:

BAMFORD. J. & VANDERKOOY. J. "*Ambisonic sound for us" Preprint from* 99*th AES Convention October* 1995 *Audio Engineering Society* (Preprint No 4138)

BEGAULT. D. "*Challenges to the successful implementation of* 3-*D sound" Journal of the Audio Engineering Society* 1991, Vol. 39, No 11, pp 864–870

BURRASTON et al (referred to above)

GERZON. M. "*Optimum reproduction matrices for multispeaker stereo" Journal of the Audio Engineering Society* 1992, Vol. 40, No 7/8, pp 571–589

GERZON. M. "*Surround sound psychoacoustics" Wireless World December* 1974, Vol. 80, pp 483–485

MALHAM. D. G "*Computer control of ambisonic soundfields" Preprint from* 82*nd AES Convention March* 1987 *Audio Engineering Society* (Preprint No 2463)

MALHAM. D. G. & CLARKE. J. "*Control software for a programmable soundfield controller" Proceedings of the Institute of Acoustics Autumn Conference on Reproduced Sound* 8, *Windermere* 1992, pp 265–272

MALHAM. D. G. & MYATT. A. "3-*D Sound spatialisation using ambisonic techniques" Computer Music Journal* 1995, Vol. 19 No 4, pp 58–70

POLETTI. M. "*The design of encoding functions for stereophonic and polyphonic sound systems" Journal of the Audio Engineering Society* 1996, Vol. 44, No 11, pp 948–963

VANDERKOOY. J. & LIPSHITZ. S. "*Anomalies of wavefront reconstruction in stereo and surround-sound reproduction" Preprint from* 83*rd AES Convention October* 1987 *Audio Engineering Society* (Preprint No 2554)

The ambisonic systems herein described are all first order, i.e. m=1 where the number of channels is given by 2m+1 for a 2-dimensional system (3 channels: w,x,y) and $(m+1)^2$ for a 3-dimensional system (4 channels: w,x,y,z). In this specification only two-dimensional systems will be considered, however the ideas presented here may readily be scaled for use with a full three-dimensional reproduction system, and the scope of the claims embraces such systems.

BRIEF DESCRIPTION OF THE DRAWINGS

FIGS. 1 and 2 are plan and cross-section views depicting an example of an immersive environment in the Vision-Dome;

FIG. 3 depicts listener/source geometry for a 2-dimensional encoding system;

FIG. 4 depicts a 2-dimensional loudspeaker layout for 4 speakers;

FIG. 5 depicts different audio decoding options for a multi-user virtual meeting place system;

FIG. 6 depicts a B-format warping example with 4 loudspeakers in a non-regular array;

FIG. 7 is a B-Format warper block diagram;

FIG. 8 is a block diagram of one decoder warp channel;

FIG. 9 depicts B-format decoding loudspeaker levels for a virtual sound source moving from (–1,–1) to (1,1);

FIG. 10 depicts B'-Format decoding loudspeaker levels for a virtual sound source moving from (–1,–1) to (1,1);

FIG. 11 depicts B-Format decoding with decoder warping loudspeaker levels for a virtual sound source moving from (–1,–1) to (1,1);

FIG. 12 depicts B'-Format decoding with decoder warping loudspeaker levels for a virtual sound source moving from (–1,–1) to (1,1);

FIG. 13 depicts B-Format decoding loudspeaker levels for a virtual sound source moving from (–1,1) to (1,1); and FIG. 14 depicts B'-Format decoding loudspeaker levels for a virtual sound source moving from (–1,1) to (1,1).

FIG. 15 depicts B-Format decoding with decoder warping loudspeaker levels for a virtual sound source moving from (–1,1) to (1,1).

FIG. 16 depicts B'-Format decoding with decoder warping loudspeaker levels for a virtual sound source moving from (–1,1) to (1,1).

DETAILED DESCRIPTION OF EXEMPLARY EMBODIMENTS

With a two-dimensional system the encoded spatialised sound is in one plane only, the (x,y) plane. Assume that the sound source is positioned inside a unit circle, i.e. $x^2+y^2 \leqq 1$ (see FIG. 3). For a monophonic signal positioned on the unit circle:

$$x=\cos(\phi)$$

$$y=\sin(\phi)$$

where $\phi$ is the angle between the origin and the desired position of the sound source, as defined in FIG. 3.

The B-Format signal comprises three signals W,X,Y, which are defined (see the Malham and Myatt reference above) as:

$$W = S \cdot \frac{1}{\sqrt{2}}$$

$$X=S\cdot\cos(\phi)$$

$$Y=S\cdot\sin(\phi)$$

Where S is the monophonic signal to be spatialised.

When the virtual sound source is on the unit circle; $x=\cos(\phi)$ and $y=\sin(\phi)$, hence giving equations for W,X,Y in terms of x & y:

$$W = \frac{1}{\sqrt{2}} \cdot S \quad \text{Ambient signal}$$

$$X=x\cdot S \quad \text{Front-Back signal}$$

$$Y=y\cdot S \quad \text{Left-Right signal}$$

As also described by Malham and Myatt, the Decoder operates as follows. For a regular array of N speakers the pantophonic system decoding equation is:

$$P_n = \frac{1}{N} W + 2X\cos(\varphi_u) + 2Y\sin(\varphi_n)$$

where $\phi_n$ is the direction of loudspeaker "n" (see FIG. 4), and thus for a regular four-loudspeaker array as shown in FIG. 4 the signals fed to the respective loudspeakers are:

$$P_1 = \frac{1}{4}W + \frac{2X}{\sqrt{2}} + \frac{2Y}{\sqrt{2}} \quad P_2 = \frac{1}{4}W - \frac{2X}{\sqrt{2}} + \frac{2Y}{\sqrt{2}}$$

$$P_4 = \frac{1}{4}W + \frac{2X}{\sqrt{2}} - \frac{2Y}{\sqrt{2}} \quad P_3 = \frac{1}{4}W - \frac{2X}{\sqrt{2}} - \frac{2Y}{\sqrt{2}}$$

It is possible, using the method of the invention, to take a B-Format ambisonic signal (or a warped B'-Format signal, to be described) and reduce the anti-phase component, thus creating a non-linear panning type signal enabling a group of users to experience spatialised sound. The reproduction is no longer an ambisonic system as true wavefront reconstruction is no longer achieved. The decoder warping algorithm takes the outputs from the ambisonic decoder and warps them before they are fed into each reproduction channel, hence there is one implementation of the decoder warper for each of the N output channels. When the signal from any of the B-Format or B'-Format decoder outputs is an out of phase component its phase is reversed with respect to the W input signal—thus by comparing the decoder outputs with W it is possible to determine whether or not the signal is out of phase. If a given decoder output is out of phase then that output is attenuated by the attenuation factor D:

$$P_n' = P_n \cdot D.$$

where $0 \leqq D < 1$ if $\mathrm{sign}(P_n) \neq \mathrm{sign}(W)$, and D=1 otherwise.

This simple algorithm reduces the likelihood of sound localisation collapsing to the nearest loudspeaker when the listener is away from the sweet-spot.

B-Format warping takes an ambisonic B-Format recording and corrects for the perceived non-linear trajectory. The input to the system is the B-Format recording and the output is a warped B-format recording (referred to herein as a B'-Format recording). The B'-Format recording can be decoded with any B-Format decoder allowing the use of existing decoders. An ambisonic system produces a 'sweet spot' in the reproduction area where the soundfield reconstructs correctly and in other areas the listeners will not experience correctly localised sound. The aim of the warping algorithm is to change from a linear range of x & y values to a non-linear range. Consider the example where a sound is moving from right to left; the sound needs to move quickly at first then slowly across the centre and finally quickly across the far left-hand to provide a corrected percept. Warping also affects the perceptual view of stationary objects, because without warping listeners away from the sweet spot will perceive most virtual sound sources to be concentrated in a few regions, the central region being typically less well populated and being a perceived audio "hole". Given the B-Format signal components X, Y & W it is possible to determine estimates of the original values of x & y, so the original signal S can be reconstructed to give $S' = W\theta\sqrt{2}$, from which the estimates x' & y' can be found:

$$x' = \frac{X}{S'} \text{ and } y' = \frac{Y}{S'}$$

$$\text{so } x' = \frac{X}{W\sqrt{2}} \text{ and } y' = \frac{Y}{W\sqrt{2}}$$

Let $\hat{x}'$ and $\hat{y}'$ represent normalised x and y values in the range (±1,±1). A general warping algorithm is given by:

$$X' = X \cdot f(\hat{x}') \text{ and } Y' = Y \cdot f(\hat{y}')$$

However, as x is a function of X, and y is a function of Y, then $$X' = X \cdot f(X) \text{ and } Y' = Y \cdot f(Y)$$

The resultant signal X', Y' & W will be referred to as the B'-Format signal. Two possible warping functions will now be described.

1) Power Warping

With power warping the value of X is multiplied by $\hat{x}'$ raised to an even power (effectively raising X to an odd power—thus keeping its sign), Y is warped in the same manner.

$$f(x) = (\hat{x}')^{2i} \text{ and } f(y) = (\hat{y}')^{2i}$$

$$f(X) = \left(\frac{X}{W\sqrt{2}}\right)^{2i} \text{ and } f(Y) = \left(\frac{Y}{W\sqrt{2}}\right)^{2i}$$

$$i.e.\ X' = X \cdot \left(\frac{X}{W\sqrt{2}}\right)^{2i} \text{ and } Y' = Y \cdot \left(\frac{Y}{W\sqrt{2}}\right)^{2i}$$

In these equations selecting i=0 gives a non-warped arrangement, whereas for i>0, non-linear warping is produced.

2) Sinusoidal Warping

With sinusoidal warping different functions, f(X) & f(Y) are used for different portions of the $\hat{x}'$ and $\hat{y}'$ ranges. The aim with sinusoidal warping is to provide a constant level when the virtual sound source is at the extremes of its range and a fast transition to the centre region. Half a cycle of a raised sine wave is used to smoothly interpolate between the extremes and the centre region.

For X:

1. $-1 < \hat{x}' \leq x_1 \quad f(X) = \frac{1}{|\hat{x}'|}$
2. $x_1 < \hat{x}' \leq x_2 \quad f(X) = \frac{1}{2 \cdot |\hat{x}'|}\left\{\sin\left(\frac{(\hat{x}' + |x_1|)\cdot\pi}{|x_2 - x_1|} + \frac{\pi}{2}\right) + 1\right\}$
3. $x_2 < \hat{x}' \leq x_3 \quad f(X) = 0$
4. $x_3 < \hat{x}' \leq x_4 \quad f(X) = \frac{1}{2 \cdot |\hat{x}'|}\left\{\sin\left(\frac{(\hat{x}' + |x_3|)\cdot\pi}{|x_4 - x_3|} + \frac{\pi}{2}\right) - 1\right\}$
5. $x_4 < \hat{x}' \leq +1 \quad f(X) = \frac{1}{|\hat{x}'|}$ For Y:

1. $-1 < \hat{y}' \leq y_1 \quad f(Y) = \frac{1}{|\hat{y}'|}$
2. $y_1 < \hat{y}' \leq y_2 \quad f(Y) = \frac{1}{2|\hat{y}'|}\left\{\sin\left(\frac{(\hat{y}' + |y_1|)\cdot\pi}{|y_2 - y_1|} + \frac{\pi}{2}\right) + 1\right\}$
3. $y_2 < \hat{y}' \leq y_3 \quad f(Y) = 0$
4. $y_3 < \hat{y}' \leq y_4 \quad f(Y) = \frac{1}{2 \cdot |\hat{y}'|}\left\{\sin\left(\frac{(\hat{y}' + |y_3|)\cdot\pi}{|y_4 - y_3|} + \frac{\pi}{2}\right) - 1\right\}$
5. $y_4 < \hat{y}' \leq +1 \quad f(Y) = \frac{1}{|\hat{y}'|}$ Typical values for the constants $x_{1 \ldots 4}$ and $y_{1 \ldots 4}$ are:

$$x_1 = y_1 = -0.75;\ x_2 = y_2 = -0.25;\ x_3 = y_3 = 0.25;\ x_4 = y_4 = 0.75$$

The use of a B-Format signal as the input to the warping algorithm has many advantages over other techniques. In a virtual meeting environment a user's voice may be encoded with a B-Format signal which is then transmitted to all of the other users in the system (they may be located anywhere in the world). The physical environment in which the other users are located may vary considerably, one may use a binaural headphone based system (see MOLLER. H. "*Fundamentals of binaural technology" Applied Acoustics* 1992, Vol. 36, pp 171–218) Another environment may be in a VisionDome using warped ambisonics. Yet others may be using single user true ambisonic systems, or transaural two loudspeaker reproduction systems, as described by Cooper and Bauck (previously referred to). The concept is shown in FIG. 5.

Two implementations of the invention (one digital, the other analogue) using proprietary equipment will now be described. In a virtual meeting environment the audio needs to be processed in real-time. It is assumed here that it is required that all decoding is executed in real-time using either analogue or DSP-based hardware.

Practical virtual meeting places may be separated by a few meters or by many thousands of kilometers. The audio connections between each participant are typically via broadband digital networks such as ISDN, LAN or WAN. It is therefore beneficial to carry out the coding and decoding within the digital domain to prevent unnecessary D/A and A/D conversion stages. The coding is carried out by using conventional B-Format coders and the decoding by a modified (warping) decoder. The exception to this is the use of non-linear panning which needs to either transmit a monophonic signal with its co-ordinates, or an N channel signal—making non-linear panning less suitable for use in a system employing remote virtual meeting places.

The Lake HURON DSP engine is a proprietary method of creating and decoding ambisonic B-Format signals, it can decode both 2-D and 3-D audio with any number of arbitrarily spaced loudspeakers. A description can be found at "lakedsp.com//index.htm". The Huron is supplied with the necessary tools to create custom DSP programs, and as the mathematics of the warping algorithms shown here are relatively simple they could be included in an implementation of an ambisonic decoder. The main advantage of this method is that the hardware is already developed and the system is capable of handling a large number of I/O channels.

A second method of digital implementation could involve programming a DSP chip on one of the many DSP development systems available from the leading DSP chip manufacturers. Such a system would require 2 or 3 input channels and a larger number of output channels (usually four or eight). Such an implementation would produce a highly specialised decoder which could be readily mass-produced.

As the technology of PCs and sound-cards increases, real-time ambisonic decoding and warping will become a practical reality—reducing the requirement for complex DSP system design.

The B-Format warping and decoder warping may alternatively be carried out in the analogue domain using analogue multipliers. A conventional ambisonic decoder may be used to perform the B'-Format decoding with the decoder outputs feeding into the decoder warper hardware, such a system is shown in FIG. 6. Block diagrams of the B-Format warper and the decoder warper are shown in FIGS. 7 and 8 respectively. The block diagrams correspond to the function blocks available from analogue multipliers, of the general kind described at analog.com/products/index/12.html.

A number of simulations using the methods described above will now be described, rather than operating in real time, as would be required for a practical embodiment, the processing used to produce these examples was computed off-line using a PC with an appropriate audio interface. Consider first an example where a single sound source is to be moved from (−1,−1) to (1,1), assuming normalised coordinates where x and y can each only take values between −1 and +1. At the beginning of the audio track the virtual sound is located at position (−1,−1) and at the end of the track the virtual sound source is located at position (1,1). The sound is coded to move linearly from its start position to its final position. For clarity of illustration the monophonic source signal to be spatialised was set to be a positive DC voltage. By using the B-Format coding technique described above, a 3-channel signal was constructed which was then decoded with the warping algorithms also described above.

FIG. 9 shows the output of each of the four loudspeaker feeds, from a four channel decoder, using a conventional ambisonic B-Format coding, with the loudspeaker geometry shown in FIG. 4. It can be seen that the virtual source is initially located near loudspeaker 3, which initially has a full magnitude output, loudspeaker 1 initially has an anti-phase output and loudspeakers 2 & 4 have the value of W. As the virtual source moves through the central region, the level of loudspeakers 1, 2, 3 & 4 are equal. At the end of the example trajectory loudspeaker 1 has a high output level, loudspeaker 3 is in anti-phase and 2 & 4 remain at the constant W level.

FIG. 10 shows the effect of introducing B-Format warping (a B'-Format signal). The loudspeakers have similar levels at the trajectory start and end points to conventional B-Format warping, however the path is now mainly in the central area thus eliminating the perception of sound "hanging around" or "collapsing to" individual loudspeakers.

The loudspeaker feeds shown in FIGS. 9 and 10 are for an ambisonic signal—where the correct signal is obtained at the sweet-spot by the vector summation of the in-phase and anti-phase signals. The decoder warping algorithm attenuates the anti-phase components presenting a more coherent signal to listeners not situated at the sweet-spot. FIG. 11 shows the basic ambisonic B-Format decoding (as seen in FIG. 9) with the addition of decoder warping applied. The removal of the anti-phase component can clearly be seen in this example where D=0. FIG. 12 shows B'-Format decoding (as seen in FIG. 10) with decoder warping, and the effect of the anti-phase attenuation can be seen.

The above example considered a trajectory of (−1,−1) to (1,1) i.e. back-left to front-right: the following example considers a trajectory of (1,1) to (−1,1) i.e. front-right to front-left. FIGS. 13, 14, 15 and 16 show, respectively, the effects of the B-Format decoder, the B'-Format decoder, the B-Format decoder with decoder warping, and the B'-Format decoder with decoder warping. In this example the anti-phase signal is more prominent due to the chosen virtual source trajectory. As with the previous example the decoder warping factor D is set to zero, removing all of the anti-phase component.

For clarity of graphical presentation, the two examples described here used a positive DC voltage as the virtual source. However in practice sine-waves and complex waveforms (actual audio signals) are used. The decoder algorithms were tested with complex waveforms to ensure their correct operation.

The final arbiter of performance of spatialised audio is the listener. An audio sound effect was coded into B-Format signals with a front-right to front-left trajectory and then decoded with the same four decoding algorithms described above. Informal listening tests were carried out in the VisionDome and the following observations were made by the listeners at the following listing positions:

1. At the sweet-spot

B-Format

The loudspeaker signals combined correctly to give the perception of a moving sound source. However, because of the geometry and acoustic properties of the listening environment, the sound did not seem to move across the listening space with a linear trajectory.

B'-Format

As with the B-Format example, the individual soundfields reconstructed correctly to give the perception of a moving sound source. The virtual sound source had a perceived linear trajectory due to the use of non-linear warping.

B-Format with decoder warping

The sound seemed to move across the listening area with a non-linear trajectory. The perception was similar to that of the B-Format example.

B'-Format with decoder warping

The sound seemed to move across the listening area with a linear trajectory. The perception was similar to that of the B'-Format example.

2. Close to front-left or front-right loudspeakers (positions 1 & 4 in FIG. 4

B-Format

The virtual sound source location "collapses" to the nearest loudspeaker—the contribution of that loudspeaker dominates the aural landscape and little or no sensation of trajectory is obtained.

B'-Format

The virtual sound source location "collapses" to the nearest loudspeaker—the contribution of that loudspeaker dominates the aural landscape, but there is a slight sensation of a trajectory, as the overall soundfield has no contribution from the rear anti-phase loudspeaker feeds.

B-Format with decoder warping

An improved sensation of movement, however the perceived trajectory is non-linear.

B'-Format with decoder warping

A clear sensation of sound moving from one position to another with an approximately linear perceived trajectory path.

3. Midway between front-left & rear-left loudspeakers 4&3) or midway between front-right & rear-right loudspeakers (1&2)

B-Format

Two distinct trajectories are perceived: The in-phase signal (from loudspeakers 4&1) moving from right to left and the anti-phase signal moving from left to right. The two distinct trajectories cause confusion and is more distracting than no trajectory at all.

B'-Format

The perception of this signal is similar to that of the B-Format signal, but to a lesser degree—there was less of a sensation of two separate virtual source trajectories.

B-Format with decoder warping

Only one trajectory was observed, however the trajectory was clearly non-linear.

B'-Format with decoder warping

Here one trajectory was observed which was more linear in its perceived trajectory than the B'-Format signal, a greater degree of non-linear distortion may make the localisation even clearer.

4. Between rear-left & rear-right loudspeakers (3&2)

B-Format

Because the two dominant loudspeaker sources are the rear loudspeakers (2&3), the dominant sound sources are the anti-phase components. The virtual sound source seems to travel in the opposite direction to that intended. The implications of this are serious when the sound source is combined with a video source in an immersive environment. To have the sound and vision moving in opposite directions is a clearly unacceptable form of modal conflict.

B'-Format

The effects observed are the same as for the B-Format signal.

B-Format with decoder warping

A clear, although non-linear, path trajectory due to the removal of the anti-phase components.

B'-Format with decoder warping

A clear linear trajectory from the front-right loudspeaker to the front-left loudspeaker.

What is claimed is:

1. A method of generating a sound field from an array of loudspeakers, the array defining a listening space wherein the outputs of the loudspeakers combine to give a spatial perception of a virtual sound source, the method comprising the generation, for each loudspeaker in the array, of a respective output component $P_n$ for controlling the output of the respective loudspeaker, the output being derived from data carried in an input signal, the data comprising a sum reference signal, and directional sound components representing the sound component in different directions as produced by the virtual sound source, wherein the method comprises steps of recognizing for each loudspeaker, whether the respective component $P_n$ is changing in phase or antiphase to the sum reference signal, modifying said signal if it is in antiphase, and feeding the resulting modified components to the respective loudspeakers.

2. A method according to claim 1, in which the directional sound components are each multiplied by a warping factor which is a function of the respective directional sound component, such that a moving virtual sound source following a smooth trajectory as perceived by a listener at any point in the listening field also follows a smooth trajectory as perceived at any other point in the listening field.

3. A method according to claim 2, wherein the warping factor is a square or higher even-numbered power of the directional component.

4. A method according to claim 2, wherein the warping factor is a sinusoidal function of the directional component.

5. Apparatus for generating a sound field, comprising an array of loudspeakers defining a listening space wherein the outputs of the loudspeakers combine to give a spatial perception of a virtual sound source, means for receiving and processing data carried in an input signal, the data comprising a sum reference signal, and directional information components indicative of the sound in different directions as produced by the virtual sound source, means for the generation from said data of a respective output component, $P_n$, for controlling the output of each loudspeaker in the array, means for recognizing, for each loudspeaker, whether the respective component $P_n$ is changing in phase or antiphase to the sum reference signal, means for modifying said signal if it is in antiphase, and means for feeding the resulting modified components to the respective loudspeakers.

6. Apparatus according to claim 5, further including means for multiplying each directional component by a warping factor which is a function of the respective directional component, such that a moving virtual sound source following a smooth trajectory as perceived by a listener at any point in the listening field also follows a smooth trajectory as perceived at any other point in the listening field.

7. Apparatus according to claim 6, wherein the warping factor is a square or higher even-numbered power of the directional component.

8. Apparatus according to claim 6, wherein the warping factor is a sinusoidal function of the directional component.

* * * * *